United States Patent
Hashitani

(10) Patent No.: US 8,598,026 B2
(45) Date of Patent: Dec. 3, 2013

(54) SEMICONDUCTOR DEVICE AND METHOD OF MANUFACTURING THE SAME

(75) Inventor: Masayuki Hashitani, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/200,252

(22) Filed: Sep. 21, 2011

(65) Prior Publication Data
US 2012/0007174 A1 Jan. 12, 2012

Related U.S. Application Data

(62) Division of application No. 12/380,144, filed on Feb. 24, 2009, now Pat. No. 8,053,820.

(30) Foreign Application Priority Data

Feb. 26, 2008 (JP) ................. 2008-044392

(51) Int. Cl.
*H01L 21/3205* (2006.01)
*H01L 21/4763* (2006.01)

(52) U.S. Cl.
USPC ........... 438/589; 438/197; 257/330; 257/343; 257/E21.429; 257/E29.135; 257/E29.258

(58) Field of Classification Search
USPC .......... 438/197, 259, 270, 589; 257/330, 331, 257/332, 334, 343, 401, E29.258, E29.027, 257/E29.028, E29.26, E29.134, E29.135, 257/E21.414, E21.419, E21.429
See application file for complete search history.

(56) References Cited

U.S. PATENT DOCUMENTS

2008/0079065 A1* 4/2008 Zhang et al. .................. 257/330

FOREIGN PATENT DOCUMENTS

JP 05110083 A * 4/1993

* cited by examiner

*Primary Examiner* — Benjamin Sandvik
*Assistant Examiner* — Leslie Pilar Cruz
(74) *Attorney, Agent, or Firm* — Adams & Wilks

(57) ABSTRACT

In a method of manufacturing a semiconductor device, a buried layer is formed in a region of a semiconductor substrate and an epitaxial growth layer is formed on the buried layer and the semiconductor substrate. Trenches are formed in the epitaxial growth layer so as to be arranged side by side in a gate width direction of a transistor to be formed, and so that an entire bottom surface of each trench is entirely surrounded by and disposed in contact with the buried layer. A gate electrode is formed inside and on a top surface of each of the trenches and on a surface of the epitaxial growth layer adjacent to each of the trenches via a gate insulating film. A high concentration source diffusion layer is formed on one side of the gate electrode. A high concentration drain diffusion layer is formed on another side of the gate electrode.

20 Claims, 4 Drawing Sheets

SEMICONDUCTOR DEVICE AND METHOD OF MANUFACTURING THE SAME

CROSS REFERENCE TO RELATED APPLICATION

This application is a division of application Ser. No. 12/380,144 filed Feb. 24, 2009, now U.S. Pat. No. 8,053,820 which is hereby incorporated by reference, and priority thereto for common subject matter is hereby claimed.

BACKGROUND OF THE INVENTION

1. Field of the Invention

The present invention relates to a semiconductor device and a method of manufacturing the semiconductor device. In particular, the present invention relates to a MOS transistor having a trench, which enhances driving performance with a use of a buried layer.

2. Description of the Related Art

A MOS transistor is a device locating at the core of electronic components, and hence downsizing, reduction of power consumption, and driving performance enhancement of the MOS transistor are important issues. As a method of enhancing the driving performance of the MOS transistor, there is given a method involving making a gate width larger, to thereby decrease the on-resistance. Enlargement of the gate width, however, causes a problem in that an occupation area of the MOS transistor becomes larger. In view of the problem, there has been proposed until now a technology in which the gate width may be made larger, while suppressing the increase of the occupation area of the MOS transistor with a use of a trench.

With reference to FIGS. 4A to 4D, a conventional semiconductor device is described.

As illustrated in a perspective view of FIG. 4A, there is provided a trench 13 in a width direction (W direction) of a MOS transistor, in which a length of an effective gate width is larger than a width of a gate electrode 15 on a surface, whereby an on-resistance per unit area may be reduced without reducing a withstanding voltage of the MOS transistor.

FIG. 4B is a schematic plan view of the MOS transistor. A cross section of the trench 13 denoted by A-A' and a cross section of a region without the trench 13 denoted by B-B' are illustrated in FIG. 4D and FIG. 4C, respectively. A region illustrated in FIG. 4C becomes a normal planer MOS transistor, and hence, when a current flows from a high concentration source diffusion layer 16 to a high concentration drain diffusion layer 17, a current path is as illustrated in FIG. 4C with an arrow A. On the other hand, in the region having the trench 13, which is illustrated in FIG. 4D, the current is obtained on a side surface parallel to the sheet in the MOS transistor width direction as illustrated with an arrow B and on a bottom portion as illustrated with an arrow C. (For example, see JP 2006-49826 A.)

However, in the conventional technology, in a case where a length of a transistor L is reduced so as to achieve more enhanced driving performance, a distance difference in effective channel length is markedly observed. In the path C of FIG. 4D and the path A of FIG. 4C, a plane region illustrated as the path A is predominant, and a current hardly flows in the bottom portion C. Accordingly, there arises a problem in that, even when the trench 13 is deeply formed and the length of an effective gate width is enlarged, to thereby reduce an on-resistance, the driving performance cannot be obtained. In addition, since a gate length (L direction) of the transistor cannot be reduced, there occurs a disturbance in which the area cannot be reduced.

As described above, in the structure of FIG. 4A, even when a trench depth is made larger or the gate width (W direction) is reduced to make the effective gate width longer, the gate length (L length direction) cannot be reduced. Accordingly, there arises a problem in that the driving performance can be obtained no more than expected, or a problem in that the area of the transistor cannot be reduced. This is because a difference in effective channel length among a top surface, a side surface, and a bottom surface of the trench is markedly observed owing to the reduction of the L length, a current is likely to flow preferentially on the top surface of the trench, and the current flowing on a bottom surface, which is a feature of the provision of the trench, reduces.

SUMMARY OF THE INVENTION

The present invention has an object to secure a current path on a bottom surface of the trench, and to obtain a driving performance as expected, namely, to suppress a decrease in driving performance, even when a length L of a MOS transistor having a trench in a semiconductor device is reduced.

In order to achieve the above-mentioned object, the present invention employs the following means.

(1) A semiconductor device including: a first conductivity type semiconductor substrate; a second conductivity type buried layer formed in a predetermined region on the first conductivity type semiconductor substrate; a first conductivity type epitaxial growth layer formed on the second conductivity type buried layer and the first conductivity type semiconductor substrate; trenches formed in the first conductivity type epitaxial growth layer and arranged side by side in a gate width direction of a transistor to be formed, and having a bottom portion reaching the second conductivity type buried layer; a gate electrode formed inside and on a top surface of each of the trenches and on a surface of the first conductivity type epitaxial growth layer adjacent to each of the trenches via a gate insulating film; a second conductivity type high concentration source diffusion layer formed on one side of the gate electrode; and a second conductivity type high concentration drain diffusion layer formed on another side of the gate electrode.

(2) A method of manufacturing a semiconductor device including: forming a second conductivity type buried layer in a predetermined region on a first conductivity type semiconductor substrate; forming a first conductivity type epitaxial growth layer on the second conductivity type buried layer and the first conductivity type semiconductor substrate; forming trenches in the first conductivity type epitaxial growth layer to be arranged side by side in a gate width direction of a transistor to be formed so that a bottom portion of each of the trenches reaches the second conductivity type buried layer; forming a gate insulating film; forming a gate electrode inside and on a top surface of each of the trenches and on a surface of the first conductivity type epitaxial growth layer adjacent to each of the trenches via the gate insulating film; and forming a second conductivity type high concentration source diffusion layer on one side of the gate electrode and a second conductivity type high concentration drain diffusion layer on another side of the gate electrode.

The present invention has a feature in which, even when the L length of the MOS transistor having a trench is reduced, the decrease in driving performance can be suppressed. A trench having a depth of the same distance as or a shorter distance than the L length of the MOS transistor is provided, and a buried layer is used in a bottom portion of the trench, whereby an effective channel length from each of a lower end of a high concentration source diffusion layer and a lower end of a high concentration drain diffusion layer to the bottom surface of the trench is made shorter than the shortest L length on the top surface of the trench. Accordingly, a current path is held on the bottom surface of the trench from a side surface thereof which is brought into contact with the source or high concentration drain diffusion layer with the use of the buried layer, whereby the driving performance is enhanced. As a result, there is produced an effect of suppressing the decrease in driving performance, even in a case where the gate length is reduced.

BRIEF DESCRIPTION OF THE DRAWINGS

In the accompanying drawings.

DETAILED DESCRIPTION OF THE PREFERRED EMBODIMENTS

Hereinafter, embodiments of the present invention are described with reference to the drawings.

Figure 1A:
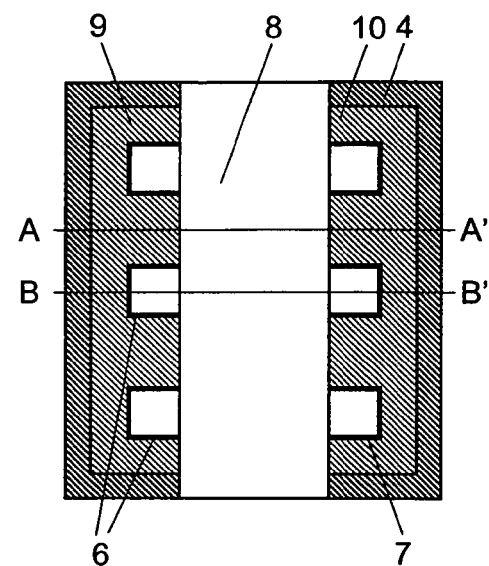
FIGS. 1A to 1C are a schematic plan view and schematic sectional views illustrating a semiconductor device according to a first embodiment of the present invention.
Figure 1B:
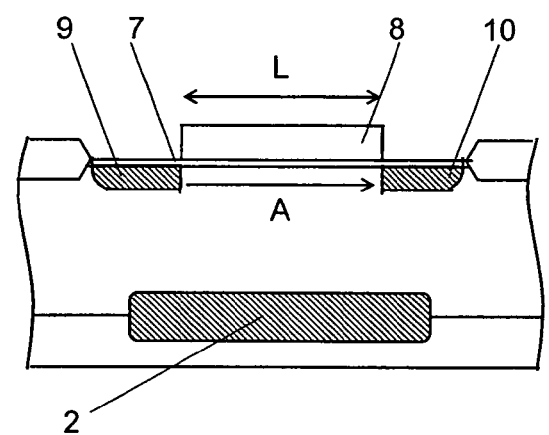
Figure 1C:
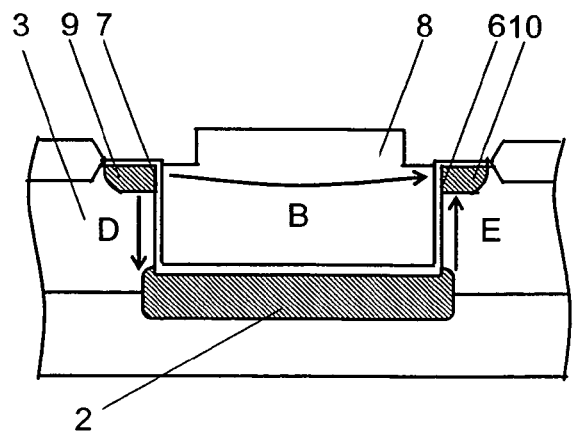

FIGS. 1A to 1C are schematic views illustrating a semiconductor device according to a first embodiment of the present invention. FIG. 1A is a schematic plan view of a MOS transistor having a trench 6. FIG. 1B is a schematic sectional view taken along the line A-A', which corresponds to a structure of a planar transistor excluding the trench 6 of FIG. 1A. FIG. 1C is a schematic sectional view taken along the line B-B' of the trench 6 of FIG. 1A. In FIG. 1B, only in a predetermined region on a first conductivity type semiconductor substrate 1, there is partially formed a second conductivity type buried layer 2, and an epitaxial growth layer 3 having the same conductivity type as that of the semiconductor substrate is formed thereon. A gate electrode 8 having a gate length L is formed on a top surface of the epitaxial growth layer 3 via a gate insulating film 7. There are formed regions opposed to and spaced away from each other by the gate length L of the gate electrode 8, the regions including a region in which a second conductivity type high concentration source diffusion layer 9 is formed and the other region in which a second conductivity type high concentration drain diffusion layer 10 is formed. In this case, a current path between the high concentration source diffusion layer 9 and the high concentration drain diffusion layer 10 is illustrated with the arrow A in FIG. 1B.

FIG. 1C is a sectional view of a region having the trench 6. On the first conductivity type semiconductor substrate 1, there is partially formed the second conductivity type buried layer 2, and the epitaxial growth layer 3 having the same conductivity type as that of the semiconductor substrate is formed thereon. In the epitaxial growth layer 3, the trench 6 is provided so as to be brought into contact with the buried layer 2. When a length of the buried layer 2 and a length of the trench 6 are compared with each other in a gate length direction, a length equal to or longer than the length of the trench 6 may be sufficient for the buried layer 2. The high concentration source diffusion layer 9 and the high concentration drain diffusion layer 10 are formed on side surfaces of the trench 6, and the gate insulating film 7 is formed on an inner surface of the trench 6, on a surface of the high concentration source diffusion layer 9, and on a surface of the high concentration drain diffusion layer 10. The trench 6 is filled with the gate electrode 8. In this structure, the following two current paths are conceivable: one is a current path indicated with the arrow B and the other is a current path (hereinafter, referred to as a current path C') from the high concentration source diffusion layer 9, a path which is indicated with the arrow D, the buried layer 2, a path which is indicated with the arrow E, to the buried layer 2. In this case, when a distance between the high concentration source diffusion layer 9 and the buried layer 2 (equal to a distance between the high concentration drain diffusion layer 10 and the buried layer 2) is a length equal to or shorter than the gate length, a current is likely to flow also in the current path C'. With this structure, driving performance of the MOS transistor can be enhanced.

FIGS. 2A to 2F are process flow views for manufacturing the semiconductor device according to the first embodiment of the present invention. Here, sectional views corresponding to FIG. 1C is used for description.

Figure 2A:
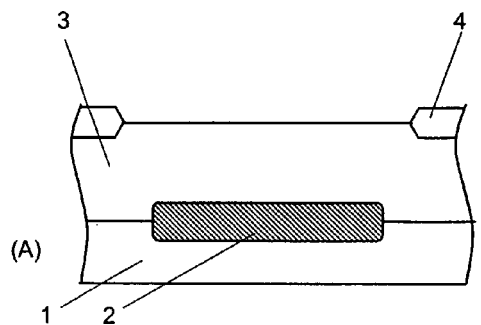
FIGS. 2A to 2F are process flow views for manufacturing the semiconductor device according to the first embodiment of the present invention.

In FIG. 2A, first, on the first conductivity type semiconductor substrate, for example, a p-type semiconductor substrate 1, in a predetermined region of the semiconductor substrate added with boron and having an impurity concentration of a resistivity ranging from 20 Ωcm to 30 Ωcm, the second conductivity type buried layer 2 is formed with the use of impurities such as arsenic, phosphorus, or antimony when the second conductivity type buried layer 2 is, for example, an n-type buried layer, at a concentration ranging from, for example, about $1\times10^{18}$ atoms/cm$^3$ to about $1\times10^{21}$ atoms/cm$^3$. Note that, when the second conductivity type buried layer 2 is, for example, a p-type buried layer, impurities such as boron may be used. Subsequently, the first conductivity type epitaxial growth layer 3 is formed on the semiconductor substrate 1 and the buried layer 2 so as to sandwich the buried layer 2. The epitaxial growth layer 3 has a thickness ranging from, for example, several μm to several ten μm. On a surface of the epitaxial growth layer 3, there is formed, by a local oxidation of silicon (LOCOS) method, a LOCOS oxide film 4.

Figure 2D:
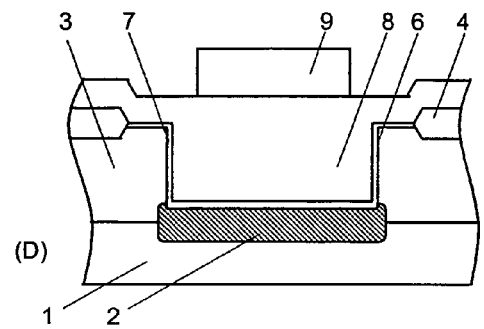
Figure 2B:
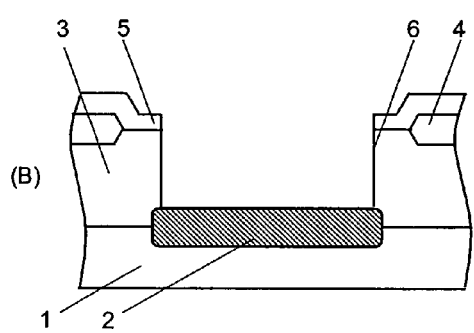
Figure 2E:
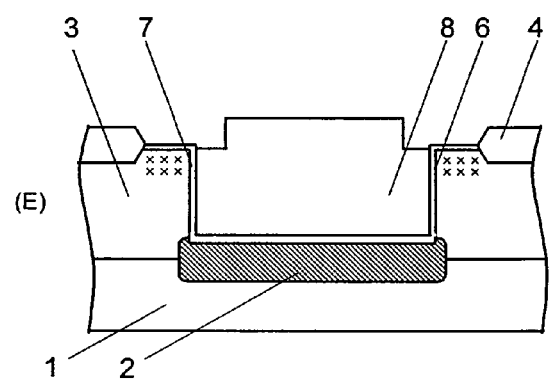
Figure 2C:
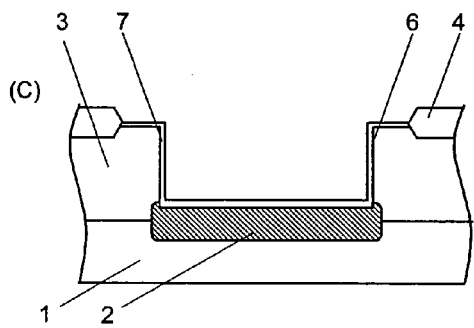

Next, as illustrated in FIG. 2B, the epitaxial growth layer 3 is patterned for trench etching with the use of a mask 5. For example, the mask 5 may be any of a thermal oxide film having a thickness ranging from several ten nm to several hundred nm and a deposited oxide film having a thickness ranging from several hundred nm to 1 μm, or may be a laminated structure of the thermal oxide film and the deposited oxide film. Further, the mask 5 may be a resist film or a nitride film. The trench 6 is formed by etching with the use of the patterned mask 5. In this case, the trench 6 is formed so as to be brought into contact with the buried layer 2. After that, the mask 5 is removed and then, as illustrated in FIG. 2C, the gate insulating film 7, for example, a thermal oxide film having a thickness ranging from several hundred to several thousand Å, is formed. Further, in a case where the second conductivity type buried layer 2 has a concentration at about a middle level to a high level, the thermal oxide film becomes thick on a surface of the second conductivity type buried layer 2. Accordingly, a capacity between the gate insulating film 7 and the second conductivity type buried layer 2 can be automatically reduced.

Figure 2F:
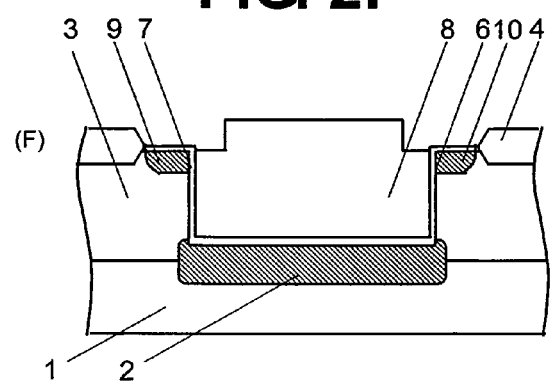

Next, as illustrated in FIG. 2D, a polycrystalline silicon gate film is formed in a thickness preferably ranging from 100 nm to 500 nm, and impurities are introduced by predeposition or an ion implantation method, whereby the gate electrode 8 is obtained. Here, the first conductivity type or the second conductivity type may be adopted. The gate electrode 8 is patterned with the use of a resist film 9, whereby a transistor structure having the trench 6 as illustrated in FIG. 2E is completed. Continuously, as illustrated in FIG. 2E, impurities are implanted so as to form a source region and a drain region by a self-alignment method. In this case, a self-alignment method is irrelevant to the essence of the present invention. As the impurity implantation to the source region and the drain region, in a case where the conductivity type is n-type, ion implantation in which arsenic or phosphorus is implanted preferably at a dose ranging from $1 \times 10^{15}$ atoms/cm$^2$ to $1 \times 10^{16}$ atoms/cm$^2$ is performed. On the other hand, in a case where the conductivity type is p-type, ion implantation in which boron or boron difluoride is implanted preferably at a dose ranging from $1 \times 10^{15}$ atoms/cm$^2$ to $1 \times 10^{16}$ atoms/cm$^2$ is performed. Here, the impurity implantation to the source region and the drain region can be performed simultaneously under the same conditions when another MOS transistor having no trench 6 within the same chip is manufactured. After that, as illustrated in FIG. 2F, the resultant is subjected to heat treatment at a temperature ranging from 800° C. to 1,000° C. for several hours, whereby the high concentration source diffusion layer 9 and the high concentration drain diffusion layer 10 are formed. As described above, the MOS transistor having the second conductivity type buried layer 2 and the trench 6 is manufactured.

Figure 3A:
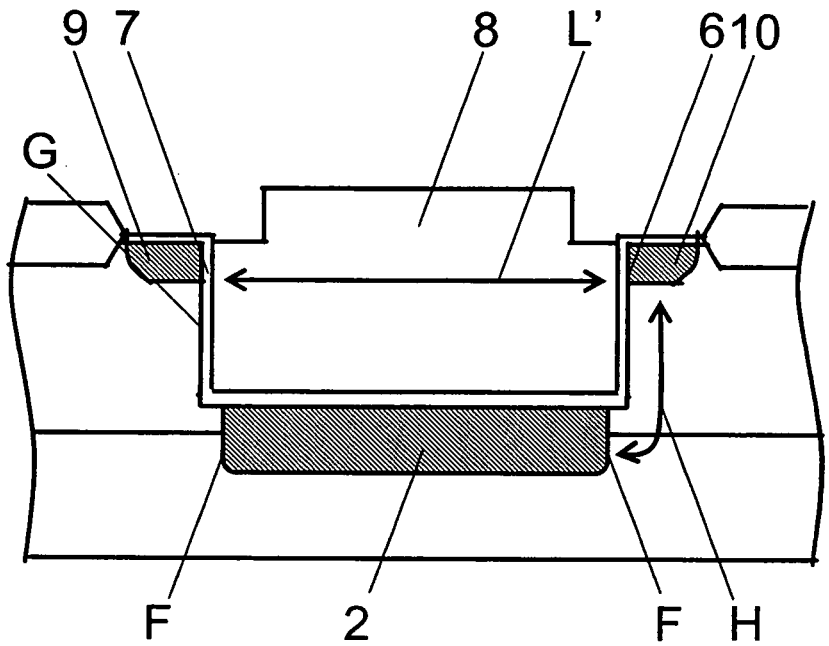
FIGS. 3A and 3B are schematic sectional views illustrating a semiconductor device according to a second embodiment of the present invention.

FIG. 3A is a schematic view illustrating a semiconductor device according to a second embodiment of the present invention. As described also in the first embodiment of the present invention, a positional relationship between the trench 6 and the second conductivity type buried layer 2 is preferably set such that an end G of a side surface of the trench 6 is positioned inwardly of an end F of a side surface of the second conductivity type buried layer 2. However, in a case where a distance H from each of a lower end of the high concentration source diffusion layer 9 and a lower end of the high concentration drain diffusion layer 10 to the second conductivity type buried layer 2 is a length equal to or shorter than a gate length L', a current flows preferentially in a current path positioned at a bottom portion of the trench 6. Accordingly, even when the end G of the side surface of the trench 6 is positioned outwardly of the end F of the side surface of the second conductivity type buried layer 2, as long as a condition in which the distance H from each of the lower end of the high concentration source diffusion layer 9 and the lower end of the high concentration drain diffusion layer 10 to the end F of the side surface of the second conductivity type buried layer 2 is a length equal to or shorter than the gate length L' is satisfied, a current flows also in the bottom portion of the trench 6, and driving performance is therefore enhanced.

Figure 3B:
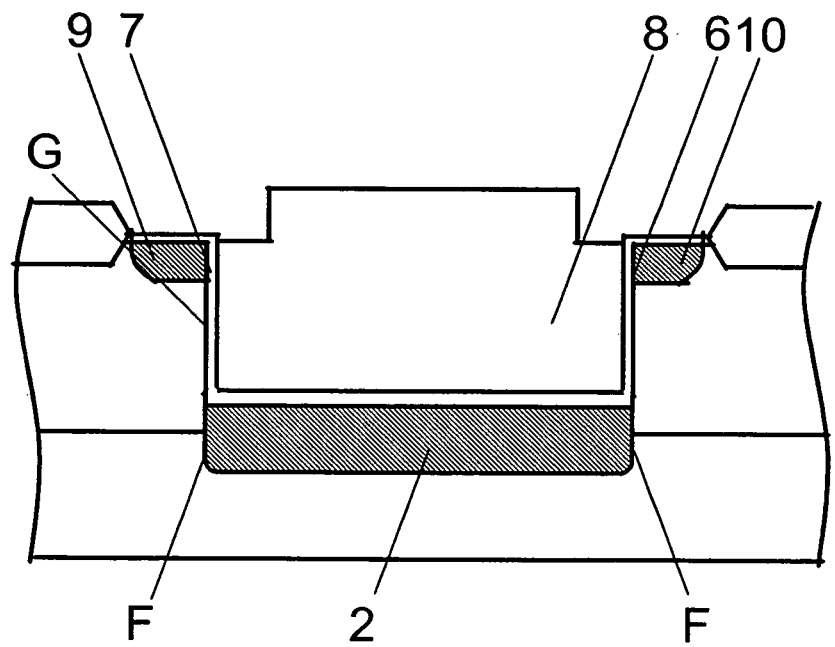
Figure 4A:
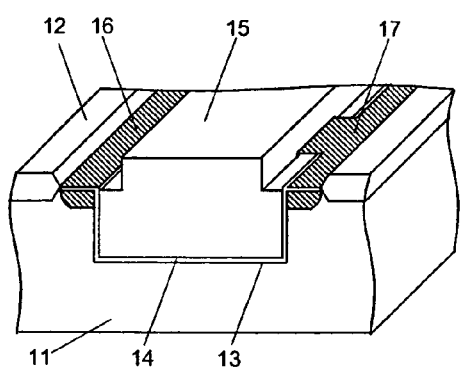
FIGS. 4A to 4D are schematic views illustrating a conventional semiconductor device.
Figure 4B:
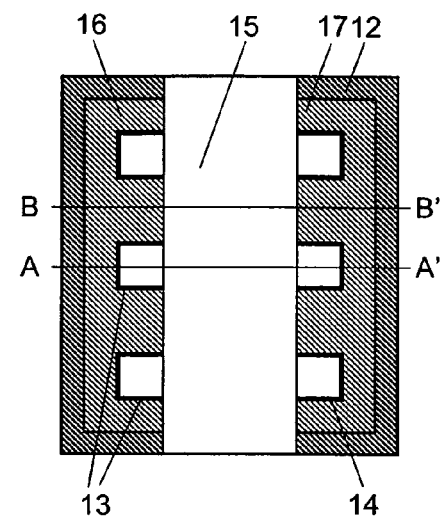
Figure 4C:
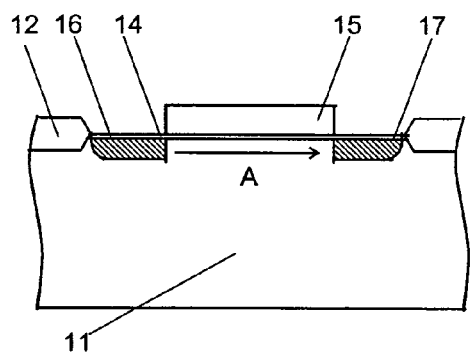
Figure 4D:
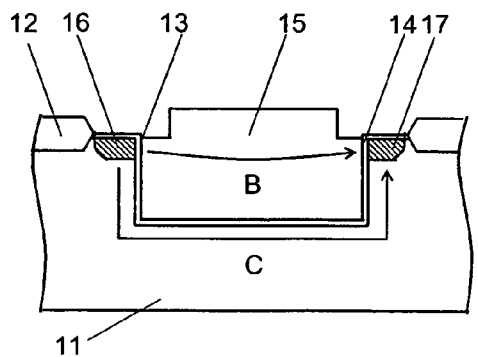

FIG. 3B illustrates a mode in which the length of the trench 6 and the length of the second conductivity type buried layer 2 are set equal to each other and the end G of the side surface of the trench 6 and the end F of the side surface of the second conductivity type buried layer 2 are aligned on the same straight line. Also in this case, as long as the condition in which the distance H from each of the lower end of the high concentration source diffusion layer 9 and the lower end of the high concentration drain diffusion layer 10 to the second conductivity type buried layer 2 is a length equal to or shorter than the gate length L' is satisfied, a current flows also in the bottom portion of the trench 6, and the driving performance is therefore enhanced.

As described above, when the buried layer is provided on the bottom portion of the trench, and the distance between the buried layer and each of the high concentration source diffusion layer and the high concentration drain diffusion layer is set to a length equal to or shorter than the gate length, a current flows in the bottom portion of the trench, and the driving performance is therefore enhanced.

What is claimed is:

1. A method of manufacturing a semiconductor device, comprising:
   forming a second conductivity type buried layer in a predetermined region on a first conductivity type semiconductor substrate;
   forming a first conductivity type, epitaxial growth layer on the second conductivity type buried layer and the first conductivity type semiconductor substrate;
   forming a plurality of trenches in the first conductivity type epitaxial growth layer so as to be arranged side by side in a gate width direction of a transistor to be formed and so that an entire bottom surface of each of the plurality of trenches is entirely surrounded by and disposed in contact with the second conductivity type buried layer;
   forming a gate insulating film;
   forming a gate electrode inside and on a top surface of each of the plurality of trenches and on a surface of the first conductivity type epitaxial growth layer adjacent to each of the plurality of trenches via the gate insulating film; and
   forming a second conductivity type high concentration source diffusion layer on one side of the gate electrode and a second conductivity type high concentration drain diffusion layer on another side of the gate electrode.

2. A method according to claim 1; wherein each of the plurality of trenches is formed with a depth of a length equal to or shorter than a gate length of the transistor to be formed.

3. A method according to claim 2; wherein the second conductivity type buried layer has a concentration ranging from about $1 \times 10^{18}$ atoms/cm$^3$ to about $1 \times 10^{21}$ atoms/cm$^3$.

4. A method according to claim 2; wherein each of the plurality of trenches is formed so as to be positioned inwardly from an end of a side surface of the second conductivity type buried layer.

5. A method according to claim 4; wherein the second conductivity type buried layer has a concentration ranging from about $1 \times 10^{18}$ atoms/cm$^3$ to about $1 \times 10^{21}$ atoms/cm$^3$.

6. A method according to claim 2; wherein each of the plurality of trenches is formed so that an end of a side surface thereof is positioned on the same plane as an end of a side surface of the second conductivity type buried layer.

7. A method according to claim 6; wherein the second conductivity type buried layer has a concentration ranging from about $1 \times 10^{18}$ atoms/cm$^3$ to about $1 \times 10^{21}$ atoms/cm$^3$.

8. A method according to claim 2; wherein the high concentration source diffusion layer and the high concentration drain diffusion layer are formed so that a distance from one of a lower end of the high concentration source diffusion layer and a lower end of the high concentration drain diffusion layer to the second conductivity type buried layer is shorter than the gate length of the transistor to be formed; and wherein each of the plurality of trenches is formed so as to be positioned outwardly of an end of a side surface of the second conductivity type buried layer.

9. A method according to claim 8; wherein the second conductivity type buried layer has a concentration ranging from about $1\times10^{18}$ atoms/cm$^3$ to about $1\times10^{21}$ atoms/cm$^3$.

10. A method according to claim 1; wherein the second conductivity type buried layer has a concentration ranging from about $1\times10^{18}$ atoms/cm$^3$ to about $1\times10^{21}$ atoms/cm$^3$.

11. A method according to claim 1; wherein each of the plurality of trenches is formed so as to be positioned inwardly from an end of a side surface of the second conductivity type buried layer.

12. A method according to claim 1; wherein each of the plurality of trenches is formed so that an end of a side surface thereof is positioned on the same plane as an end of a side surface of the second conductivity type buried layer.

13. A method according to claim 1; wherein the high concentration source diffusion layer and the high concentration drain diffusion layer are formed so that a distance from one of a lower end of the high concentration source diffusion layer and a lower end of the high concentration drain diffusion layer to the second conductivity type buried layer is shorter than the gate length of the transistor to be formed; and wherein each of the plurality of trenches is formed so as to be positioned outwardly from an end of a side surface of the second conductivity type buried layer.

14. A method of manufacturing a semiconductor device, comprising:
    forming a buried layer in a predetermined region on a semiconductor substrate;
    forming an epitaxial growth layer on the buried layer and the semiconductor substrate;
    forming a plurality of trenches in the epitaxial growth layer so as to be arranged side by side in a gate width direction and so that an entire bottom surface of each of the plurality of trenches is entirely surrounded by and disposed in contact with the buried layer;
    forming a gate electrode inside and on a top surface of each of the plurality of trenches and on a surface of the epitaxial growth layer adjacent to each of the plurality of trenches via a gate insulating film;
    forming a high concentration source diffusion layer on one side of the gate electrode; and
    forming a high concentration drain diffusion layer on another side of the gate electrode.

15. A method according to claim 14; wherein each of the plurality of trenches is formed so as to be positioned inwardly from an end of a side surface of the buried layer.

16. A method according to claim 14; wherein each of the plurality of trenches is formed so that an end of a side surface is positioned on the same plane as an end of a side surface of the buried layer.

17. A method according to claim 14; wherein the buried layer has a concentration ranging from about $1\times10^{18}$ atoms/cm$^3$ to about $1\times10^{21}$ atoms/cm$^3$.

18. A method of manufacturing a semiconductor device, comprising:
    forming a buried layer in a predetermined region on a semiconductor substrate;
    forming an epitaxial growth layer on the buried layer and the semiconductor substrate;
    forming a plurality of trenches in the epitaxial growth layer so as to be arranged side by side in a gate width direction of a transistor to be formed, so that each of the plurality of trenches has a depth of a length equal to or shorter than a gate length of the transistor to be formed, and so that an entire bottom surface of each of the plurality of trenches is entirely surrounded by and disposed in contact with the buried layer;
    forming a gate electrode inside and on a top surface of each of the plurality of trenches and on a surface of the epitaxial growth layer adjacent to each of the plurality of trenches via a gate insulating film; and
    forming a high concentration source diffusion layer and a high concentration drain diffusion layer on one side and on another side, respectively, of the gate electrode so that a channel length from each of a lower end of the high concentration source diffusion layer and a lower end of the high concentration drain diffusion layer to the bottom surface of each trench is shorter than a shortest length of the top surface of each trench.

19. A method according to claim 18; wherein the buried layer has a concentration ranging from about $1\times10^{18}$ atoms/cm$^3$ to about $1\times10^{21}$ atoms/cm$^3$.

20. A method according to claim 18; wherein each of the plurality of trenches is formed so as to be positioned inwardly from an end of a side surface of the buried layer.

* * * * *